United States Patent
Somekh

(10) Patent No.: US 6,427,703 B1
(45) Date of Patent: *Aug. 6, 2002

(54) METHOD AND APPARATUS FOR REMOVING CARBON CONTAMINATION IN A SUB-ATMOSPHERIC CHARGED PARTICLE BEAM LITHOGRAPHY SYSTEM

(75) Inventor: Sasson Somekh, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/510,117

(22) Filed: Feb. 22, 2000

Related U.S. Application Data

(63) Continuation-in-part of application No. 09/290,282, filed on Apr. 13, 1999.

(51) Int. Cl.[7] ............................. B08B 7/00; B08B 7/04
(52) U.S. Cl. ............................. 134/1.1; 134/1; 134/2; 134/21; 134/22.1; 134/22.18; 134/34; 134/37; 134/39; 250/492.2
(58) Field of Search ............................. 134/1, 1.3, 2, 21, 134/22.1, 22.15, 22.18, 34, 37, 39, 1.1; 250/492.2

(56) References Cited

U.S. PATENT DOCUMENTS

| 5,312,519 A | * | 5/1994 | Sakai et al. ............... 134/1 |
| 5,466,942 A | * | 11/1995 | Sakai et al. ............... 250/492.2 |
| 5,539,211 A | * | 7/1996 | Ohtoshi et al. ............... 134/1.1 X |
| 5,981,960 A | * | 11/1999 | Ooach et al. ............... 250/492.2 |

OTHER PUBLICATIONS

Grill, Cold Plasma in Material Fabrikation, IEEE Press, pp. 97 and 109, 1994.*

* cited by examiner

Primary Examiner—Alexander Markoff
(74) Attorney, Agent, or Firm—Degosits & Noah LLP.

(57) ABSTRACT

A cleaning system for use with a micro-column array, electron beam lithography system is described. The cleaning system includes an oxidizer source and an oxidizer distribution mechanism that introduces an oxidizer into the imaging chamber of the lithography system. The oxidizer is pumped into the chamber at a flow rate and pressure that maintains a required sub-atmospheric pressure within the imaging chamber. The oxidizer acts to oxidize carbon contamination that may be present in the imaging chamber or on the surfaces of components within the chamber, such as the imaging mask. A volatile oxidized carbon gas is produced by the oxidization of the carbon contaminants. The oxidized carbon gas is pumped out of the imaging chamber to thereby remove the carbon contamination from the chamber.

22 Claims, 8 Drawing Sheets

METHOD AND APPARATUS FOR REMOVING CARBON CONTAMINATION IN A SUB-ATMOSPHERIC CHARGED PARTICLE BEAM LITHOGRAPHY SYSTEM

CROSS-REFERENCE TO RELATED APPLICATION

The present application is a continuation-in-part of U.S. patent application Ser. No. 09/290,282 filed on Apr. 13, 1999, which is assigned to the assignee of the present application.

FIELD OF THE INVENTION

The present invention relates generally to lithography systems for semiconductor fabrication, and more specifically to reducing carbon contamination in sub-atmospheric charged particle beam lithography systems.

BACKGROUND OF THE INVENTION

Photolithography has become a critical enabling technology in the fabrication of modem integrated circuit (IC) devices. The photolithography process typically involves exposing a patterned mask to collimated radiation to produce patterned radiation. The patterned radiation is then passed through an optical reduction system, and the reduced patterned radiation or mask image is projected onto a substrate, which is typically a silicon wafer upon which other materials are deposited or incorporated. For fabrication using photolithography processes, the substrate is typically coated with photoresist. The radiation exposure changes the properties of the photoresist and allows subsequent processing of the substrate.

As the degree of circuit integration has increased, the feature sizes of IC's have dramatically decreased. To support future semiconductor fabrication requirements, lithography systems using charged particle beams, such as electron beams or ion beams, have been developed to overcome limitations of traditional optical systems. In charged particle beam projection lithography systems, portions of a mask are illuminated with a charged particle beam to project an image of the mask onto a substrate. Several new charged particle beam lithography systems have been developed to extend lithography capabilities to sub-0.15 micron feature size levels. One such system is a microcolumn electron beam system developed by IBM. This system uses a large number of miniature electron beam writers in a phased array to project mask images on the order of 0.1 micron wafer geometries. Another such system is a SCALPEL® electron beam lithography system developed by AT&T Bell Laboratories; SCALPEL, stands for "Scattering with Angular Limitation in Projection Electron-beam Lithography" and is a registered trademark of AT&T Bell Laboratories of Murray Hill, N.J. The SCALPEL lithography system projects high-energy electrons through an electron beam scattering mask. A similar lithography system for next generation sub-0.1 micron circuits, is the PREVAIL (Projection-Reduction Exposure with Variable Immersion Layer) system recently developed by IBM.

A significant disadvantage associated with present charged particle beam lithography systems is a susceptibility to carbon, or carbon-containing material, contamination on the mask, walls, and other surfaces of the imaging (or process) chamber of the lithography system. Repeated exposure of a mask to charged particle beams tends to cause a build-up of carbon on the mask if sufficiently high enough levels of carbon contaminants are present in the imaging chamber. FIG. 1A illustrates a side view of a mask, such as a mask used in a SCALPEL lithography system. The mask has an image pattern formed on it and is used to project a reduced image pattern onto a substrate. The critical dimension (CD) represents the smallest feature size or spacing between features routinely produced on the substrate forming the integrated circuit device. The CD is controlled by feature 102 on mask 100 which has a dimension 104, and which produces the CD on the wafer. For a mask used in the SCALPEL lithography system, feature 102 represents a "blocking" region and surface 106 represents a transparent region. A blocking region scatters incident electrons and a transparent region transmits incident electrons.

Carbon deposits on the mask or on the wafer may cause the CD to change (usually to increase). This effect is illustrated in FIG. 1B, in which carbon deposit 112 on feature 102 has increased the dimension of feature 102 from a first width 104 to a second width 114. Carbon deposits on the features of the mask can also cause heating of the mask features due to excessive absorption, rather than scattering, of incident electrons. Such heating can cause the mask features to become undesirably distorted.

Even in cases in which the degree of carbon deposition on the mask is not significant enough to alter the CD, the presence of contaminants on the mask and aperture surfaces can cause unwanted deflection of an electron beam that passes through the mask and/or other apertures. With reference to FIG. 1B, carbon deposit 116 on the transparent region of the mask 100 can cause incident electrons to be undesirably scattered and thereby produce an unwanted image on the wafer. Thus, even minute amounts of carbon contamination can adversely affect the imaging process within electron beam lithography systems.

Newer semiconductor lithography tools may use micro-column array (MCA) electron beam systems for wafer fabrication, inspection, and/or metrology. These systems are built by arranging a number of single micro-column electron sources in either linear or rectangular arrays. MCA lithography systems typically image a stored pattern directly onto a resist coated mask substrate (e.g., Cr on glass), as opposed to imaging through a projection mask. Carbon contamination can deposit onto the resist surface and absorb some of the incident energy, thereby affecting the exposure dose. In MCA systems, carbon contamination can also clog the apertures in the imaging system. Such aperture clogging and dose alteration can cause serious problems for present MCA lithography systems.

Carbon contamination can also pose a problem in charged particle beam (typically, electron beam) metrology systems. Carbon deposits in metrology systems usually result in line widening which results in the measured CD being larger than the true CD due to the built up layer of carbon. The same type of problem also effects various defect review tools that are used in the inspection and production of semiconductor wafers.

Carbon contamination can be introduced by various sources into the imaging chamber that contains the electron source, mask, wafer, and imaging components of a charged particle beam lithography system. These sources of contamination include hydrocarbon vapor that might be present in the chambers or carbon residue in the wiring or electron sources, stage supports, and other similar sources. While it is possible to reduce carbon contamination by ensuring that exclusively non-carbon materials are used in the imaging chamber, or by physically cleaning the chamber and mask often and thoroughly, such measures are typically very expensive and time consuming, and limit the throughput of the lithography system. Moreover, such methods may not totally remove the carbon contamination in the imaging chamber, since organic compounds are often present in the masks and wafers themselves.

In light of the above, there is a need in the art for a system that removes carbon contamination deposited within the chambers of a charged particle beam photolithography apparatus.

SUMMARY OF THE INVENTION

The present invention relates to a cleaning system that prevents build-up of carbon deposits in an imaging chamber of a sub-atmospheric charged particle beam lithography system. In particular, the invention relates to a cleaning system that eliminates built-up carbon deposits on mask and imaging chamber surfaces in the sub-atmospheric charged particle beam lithography system comprising an array of multiple charged particle beam sources.

A cleaning system for use with a sub-atmospheric charged particle beam lithography system is described. In one embodiment of the present invention, the cleaning system includes an oxidizer source that introduces an oxidizer into an imaging chamber of the lithography system to oxidize carbon contamination that has built up on the surfaces within the chamber, such as the mask and chamber walls. A volatile gas species comprising oxidized carbon gas is produced from the oxidization process. This volatile gas is pumped out of the chamber by a vacuum pump coupled to the imaging chamber, to thereby remove the carbon contaminant deposits from the imaging chamber.

In one embodiment of the present invention, a cleaning process comprises directing an oxidizer, such as oxygen gas, across the mask to remove carbon deposits from the mask while the mask is situated in the imaging chamber and the chamber is maintained at a sub-atmospheric pressure. In accordance with this embodiment of the present invention, the cleaning process is performed periodically after a pre-determined number of wafers have been processed. In an alternative embodiment of the present invention, the cleaning process is performed continuously by introducing an oxidizer into the imaging chamber while each wafer is being processed.

BRIEF DESCRIPTION OF THE DRAWINGS

The present invention is illustrated by way of example and not limitation in the figures of the accompanying drawings, in which like references indicate similar elements, and in which.

DESCRIPTION OF THE PREFERRED EMBODIMENTS

One embodiment of the present invention is a cleaning system for a sub-atmospheric charged particle beam lithography system. In the following description, for purposes of explanation, numerous specific details are set forth in order to provide a thorough understanding of the present invention. It will be evident, however, to one of ordinary skill in the art, that the present invention may be practiced without these specific details. In other instances, well-known structures and devices are shown in block diagram form to facilitate explanation. The description of preferred embodiments is not intended to limit the scope of the claims appended hereto.

Figure 2A:
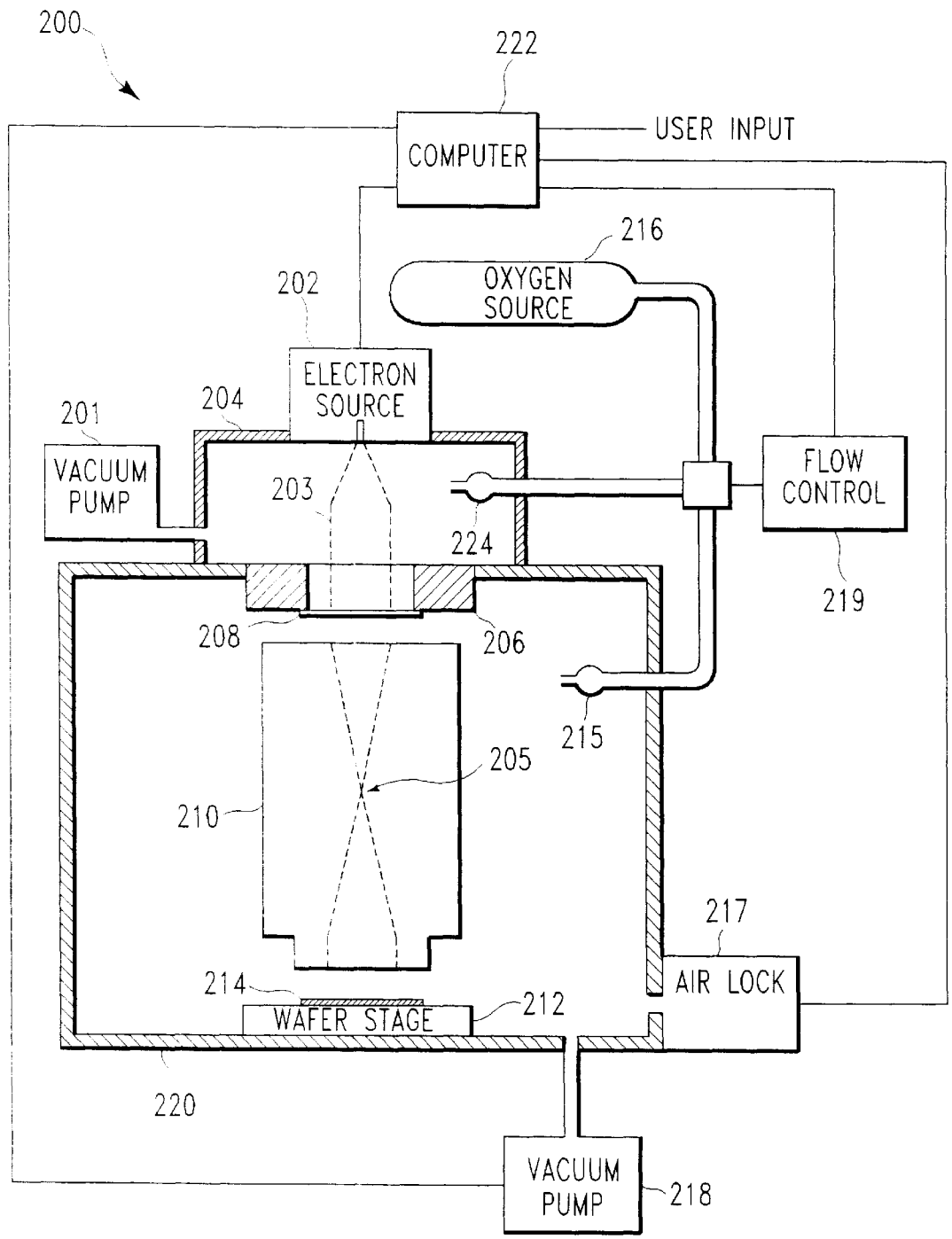
FIG. 2A illustrates an oxygen-based cleaning system for a sub-atmospheric electron beam lithography system, according to one embodiment of the present invention.

During charged particle beam lithography, high energy charged particle beams are projected through a mask to project an image of portions of the mask onto a substrate, such as a silicon wafer. Typical charged particle beam lithography systems use electron beam or ion beam projection systems to fabricate, or otherwise process, a wafer using an image mask. FIG. 2A is a cross sectional illustration of an electron beam lithography system 200 for use in semiconductor processing, and that implements embodiments of the present invention. Such semiconductor processing could include wafer fabrication, inspection, and/or metrology.

In one embodiment of the present invention, a carbon deposit cleaning system is implemented in a SCALPEL (Scattering with Angular Limitation in Projection Electron-beam Lithography) system. FIG. 2A is a cross sectional illustration of a basic SCALPEL system that has been modified for use with embodiments of the present invention.

As is well known, in a SCALPEL system, high-energy electrons are projected through a mask to project an image of the mask onto the substrate. The mask generally consists of a low atomic number membrane covered with a layer of a high atomic number material. The mask pattern is formed in the high atomic number material as a pattern layer. The mask is nearly transparent to electrons at the energies used to transmit the electrons (typically 100 keV); however, the difference in electron scattering characteristics between the low atomic number membrane and high atomic number patterned layer provides sufficient contrast to project an image onto the wafer. The electrons transmitted through the membrane are substantially unscattered and the electrons transmitted through the pattern layer are scattered. The SCALPEL system includes an aperture in the back-focal plane of the projection optics that blocks the strongly scattered electrons. This forms a high contrast image at the wafer plane.

With reference to FIG. 2A, system 200 represents a SCALPEL lithography system that includes embodiments of the present invention. The lithography system includes an electron source 202, which is typically implemented as an electron gun. Electron source 202 projects beams of electrons in the form of a high density electron flux 203 through an illumination column in an illumination chamber 204 to mask stage 206. Mask stage 206 holds a mask 208 that includes an electron transparent membrane layer and a pattern layer. The electron beams pass through the mask 208 and an imaging (or projection) column 210 to form focused electron beams 205 that are projected onto a wafer 214 held by wafer stage 212. Imaging column 210 also includes a back-focal plane aperture (shown as element 312 in FIG. 3) that blocks scattered electrons and allows unscattered electrons to pass through to the wafer 214.

The mask stage 206, wafer stage 212, and imaging column 210 are enclosed within a process chamber 220. For a SCALPEL system, the process chamber 220 is generally maintained at a sub-atmospheric environment, and thus may also be referred to as a vacuum chamber. The mask stage 206 and wafer stage 212 are generally mounted to the top and bottom of a large metal block referred to as a metrology plate (not shown to avoid unnecessarily obscuring the illustration) that serves as a thermal and mechanical stabilizer for the entire optical system. A vacuum pump 218 is coupled to the process chamber 220 to create a vacuum within chamber 220 during the imaging process. As stated above, during wafer fabrication, the process chamber 220 is maintained at a sub-atmospheric (vacuum or partial vacuum) state. For a typical SCALPEL system, the process chamber is generally maintained under a vacuum of $10^{-6}$ to $10^{-7}$ Torr, while the illumination chamber maintained under a vacuum of $10^{-8}$ to $10^{-9}$ Torr.

At such low pressures, gas molecules generally follow their initial trajectory until they strike the walls. Any carbon that is present will likely stick to the walls, thus creating carbon contamination within the chambers. However, oxidizing the carbon creates an oxidized carbon gas (CO or $CO_2$) that exhibits a relatively low sticking coefficient. This gas can then be effectively removed from the illumination and/or process chamber with the vacuum pump.

Also coupled to the imaging chamber 220 are one or more air locks 217 that allow the exchange of wafers to and from the process chamber 220, without breaking the vacuum within the process chamber 220 during wafer fabrication. For this embodiment, illumination chamber 204 and process chamber 220 together comprise an imaging chamber for system 200. Thus, unless otherwise indicated, for the embodiment illustrated in FIG. 2A, the term 'imaging chamber' as used herein includes both illumination chamber 204 and process chamber 220. For this embodiment, mask stage 206 and mask 208 do not form an airtight barrier between the two chambers 204 and 220. It should be noted that for other embodiments of the present invention, the imaging chamber may refer to either the illumination chamber or the process chamber alone, as opposed to both chambers together.

In one embodiment of the present invention, mask 208 is mounted within or attached to a support ring (not shown to avoid unnecessarily obscuring the illustration) that is coupled to mask stage 206. For this embodiment, mask stage 206 includes an opening that allows electrons to pass through the mask 208, and also allows gas to flow over the surface of mask 208. Depending on the lithography system used, other mask support structures are also possible.

Figure 1A:
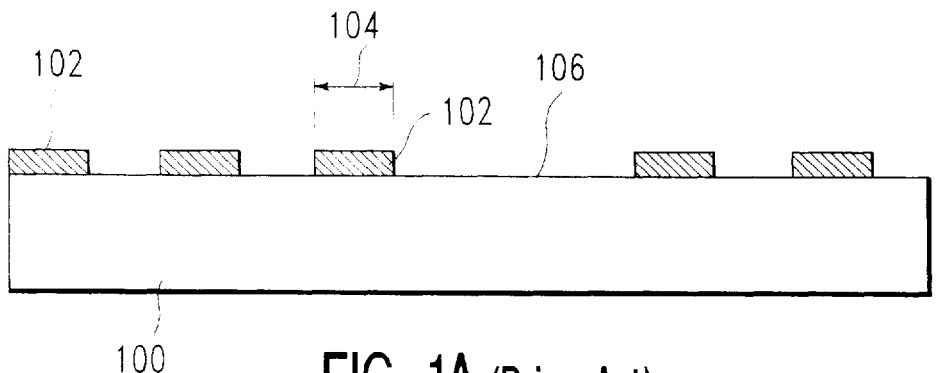
FIG. 1A is a side view of a mask.
Figure 1B:
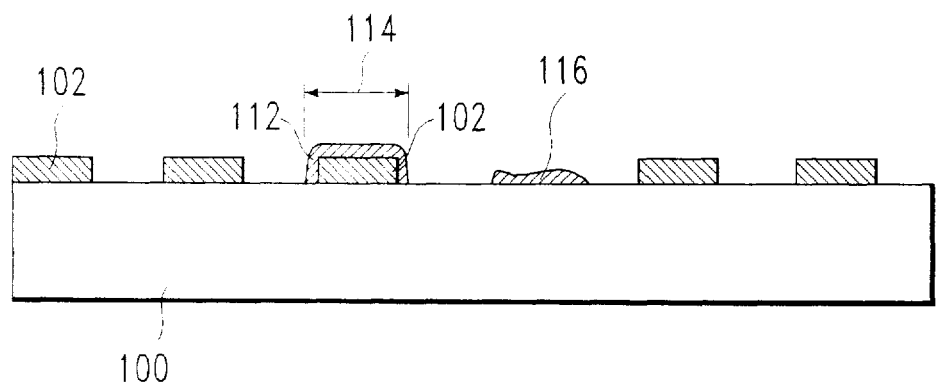
FIG. 1B is a side view of the mask of FIG. 1A illustrating the effect of carbon deposits on the mask.

A problem associated with present SCALPEL lithography systems, and other charged particle beam projection lithography systems, is the possibility of carbon build-up on the mask, wafer, and/or other surfaces within the imaging chamber during the lithography process. The presence of carbon contamination, either in the form of hydrocarbon vapor in the imaging chamber or organic materials on surfaces within the chamber (e.g., wires, walls, and so on) can cause carbon deposition on the mask or wafer during chamber operation. These carbon deposits can negatively impact the imaging effectiveness of the system by undesirably scattering an electron beam, or by increasing the feature size of the mask image, as illustrated in FIGS. 1A and 1B. Although it is possible to minimize such carbon contamination in the imaging chamber, it is not always possible or cost-efficient to maintain a carbon-free system, since carbon can be easily introduced by many different sources. For example, continuous exposure of the wafer to electron-beam processing causes a release of carbon through the outgassing from the wafer and the presence of organic materials in the wafer.

In one embodiment of the present invention shown in FIG. 2A, lithography system 200 includes an oxidizer source 216 that introduces an oxidizer into illumination chamber 204 and process chamber 220 (together, the imaging chamber) at a predetermined pressure and rate of flow. The oxidizer provided by oxidizer source 216 is typically in the form of pure oxygen gas. In an alternative embodiment of the present invention, the oxidizer may be sourced from any oxygen containing compound, such as $O_3$, $N_2O$, water vapor, doped oxygen compounds, alcohol compounds, and other like compounds that are either neutral or ionized. In a further alternative embodiment of the present invention, the oxidizer may be any gaseous compound that can be introduced into the imaging chamber and that acts to oxidize any resident carbon into a volatile gas species. The selection of the oxidizer must be made keeping in mind that the oxidizer should not corrode or damage other components of the lithography system.

In one embodiment of the present invention, the oxidizer provided by oxidizer source 216 is in an activated state. The oxidizer is activated by one of several different possible methods, including thermal activation, ozone activation, activation by a microwave source or remote plasma source, or other similar methods. For this embodiment, oxidizer source 216 includes microwave circuitry to activate the oxidizer, or other circuitry that is appropriate for the oxidizer activation method.

In one embodiment of the present invention, oxidizer is introduced at specified flow rates until particular partial pressures within the illumination chamber 204 and process chamber 220 are reached. For high-pressure applications, such as those in which a large diameter wafer 214 is processed or in a system that is subject to heavy carbon build-up, oxidizer is pumped into the imaging chamber from oxidizer source 216 through a high pressure pump. A flow control unit 219 controls the flow of oxidizer into the imaging chamber. The flow control unit 219 allows a user to independently specify and monitor the flow of oxidizer to the illumination chamber 204 and process chamber 220, on a precise basis. The actual oxidizer flow rates and pressures that are maintained depends on several factors, including the size of the mask 208, the volume of the illumination chamber 204, the volume of the process chamber 220, and the amount of carbon contamination that is to be removed. For a sub-atmospheric lithography system, oxidizer is introduced at a rate and pressure that maintains the sub-atmospheric environment within the imaging chamber.

In one embodiment of the present invention a computer 222 is used to control the vacuum pump 218, electron source 202, flow control unit 219 and one or more air locks 217. The computer 222 can automatically control the cleaning process by coordinating the operation of the lithography system 200 components. The computer 222 also allows the lithography system 200 components to be manually controlled by an operator through a user input. The user input may also be connected to other control systems that can coordinate the operation of the lithography system 200 with other connected wafer processing components, including a wafer transportation system or a cluster tool.

For the embodiment of the present invention illustrated in FIG. 2A, oxidizer is introduced into illumination chamber 204 through a nozzle 224 inserted through a wall of the illumination chamber 204, and into process chamber 220 through a nozzle 215 that is inserted through a wall of the process chamber 220. Since carbon contamination on the mask itself is typically the most critical in a SCALPEL system, the nozzle 215 is configured to direct the oxidizer flow across a surface of the mask 208. Alternatively, however, the nozzles 215 and 224 may be aimed or configured to direct oxidizer over other surfaces in the illumination chamber 204 and process chamber 220 such as the walls or the wafer area. This allows the oxidizer to be concentrated at the regions in which removal of carbon build-up is most desired. The diameter of nozzles 215 and 224, and the extent to which they extend into the illumination chamber 204 and process chamber 220 can be adjusted depending on the requirements of the cleaning system and the physical and operational constraints of the lithography system 200.

Although the embodiment illustrated in FIG. 2A shows the introduction of the oxidizer into the illumination chamber 204 and process chamber 220 by means of nozzles 215 and 224, it is to be noted that the oxidizer can be introduced into the imaging chamber in a number of different ways. For example, in alternative embodiments of the present invention, the oxidizer can introduced into the imaging chamber through a gas injection manifold or a shaped tube with air inlet holes, that distribute the oxidizer generally into the imaging chamber and across the surface of the mask 208.

Figure 2B:
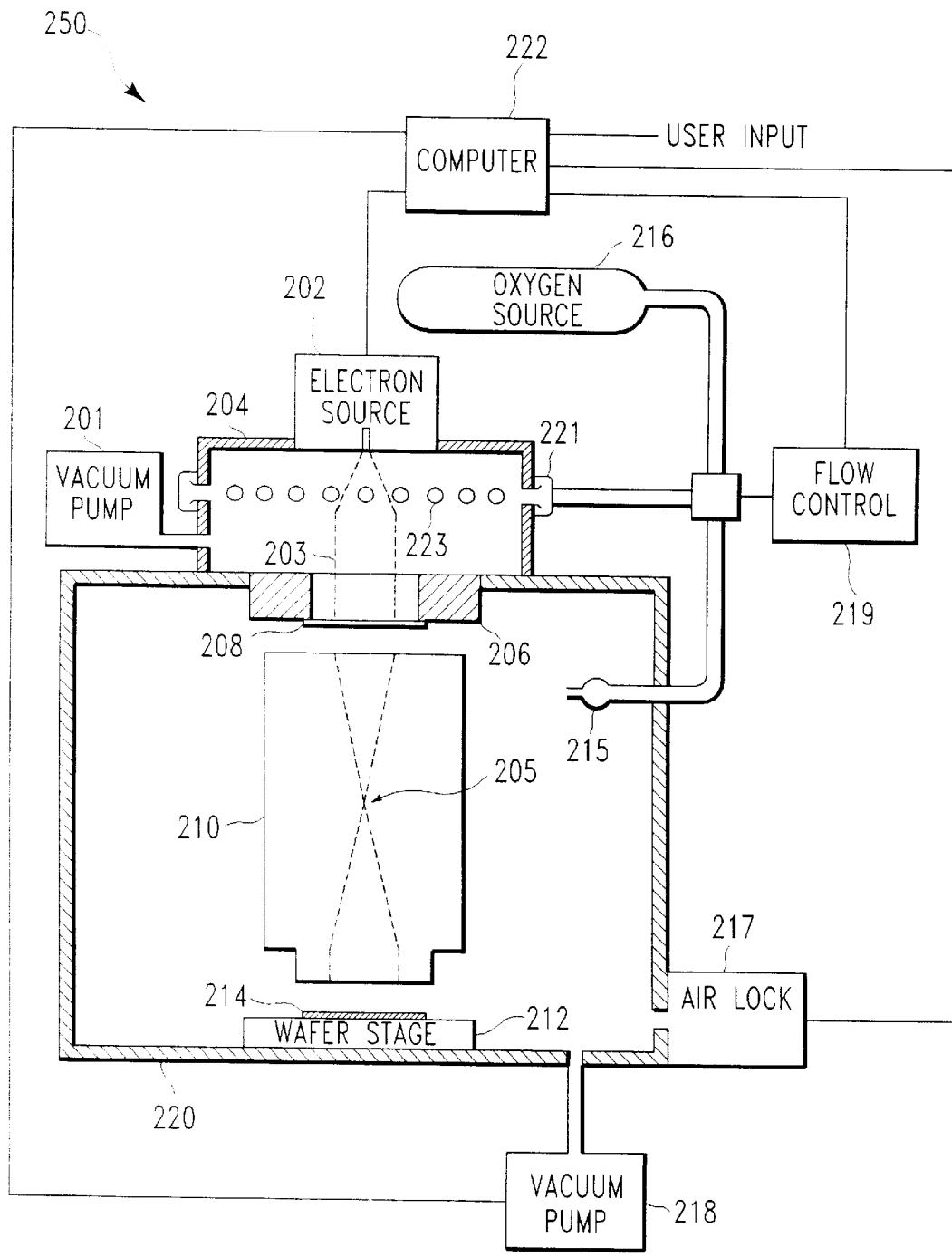
FIG. 2B illustrates an oxygen-based cleaning system for a sub-atmospheric electron beam lithography system, according to an alternative embodiment of the present invention.

FIG. 2B illustrates an electron beam lithography system that implements a cleaning system according to an alternative embodiment of the present invention. For this embodiment, the oxidizer supplied by oxidizer source 216 is pumped into illumination chamber 204 through gas injection manifold 221. Gas injection manifold 221 includes a plurality of inlet holes 223 to direct the oxidizer into the illumination chamber 204. The gas injection manifold 221 is positioned within the illumination chamber 204 such that the inlet holes 223 are distributed around the inside surface of the illumination chamber 204 and are substantially flush with the inside surface of the illumination chamber 204. Thus, in FIG. 2B, which illustrates a cross-sectional view of the electron-beam lithography system 250, gas injection manifold 221 runs continuously along the inside surface of the illumination chamber 204.

In one embodiment of system 250 illustrated in FIG. 2B, gas injection manifold 221 is a hollow chamber that distributes the oxidizer supplied by oxidizer source 216 through each of the inlet holes 223. Alternatively, gas injection manifold 221 may include individual nozzles coupled to each of the inlet passages 223 to direct the oxidizer into the illumination chamber 204 in a specific direction or pattern. As illustrated in FIG. 2B, the configuration and location of the gas injection manifold 221 and the inlet holes 223 within the gas injection manifold 221 are arranged to direct the flow of the oxidizer across the surface of mask 208. However, it should be noted that the configuration and location of the inlet holes 223 and gas injection manifold 221 within the illumination chamber 204 can be varied from the configuration illustrated in FIG. 2B to provide different oxidizer flow patterns with the illumination chamber 204. The configuration and operation of the other components illustrated in FIG. 2B correspond to the description provided above with reference to FIG. 2A.

For the embodiment illustrated in FIG. 2B, oxidizer may also be introduced into the imaging chamber by a nozzle 215 inserted into the process chamber 220. Alternatively, in system 250, oxidizer is introduced into the imaging chamber only through gas injection manifold 221.

Figure 2C:
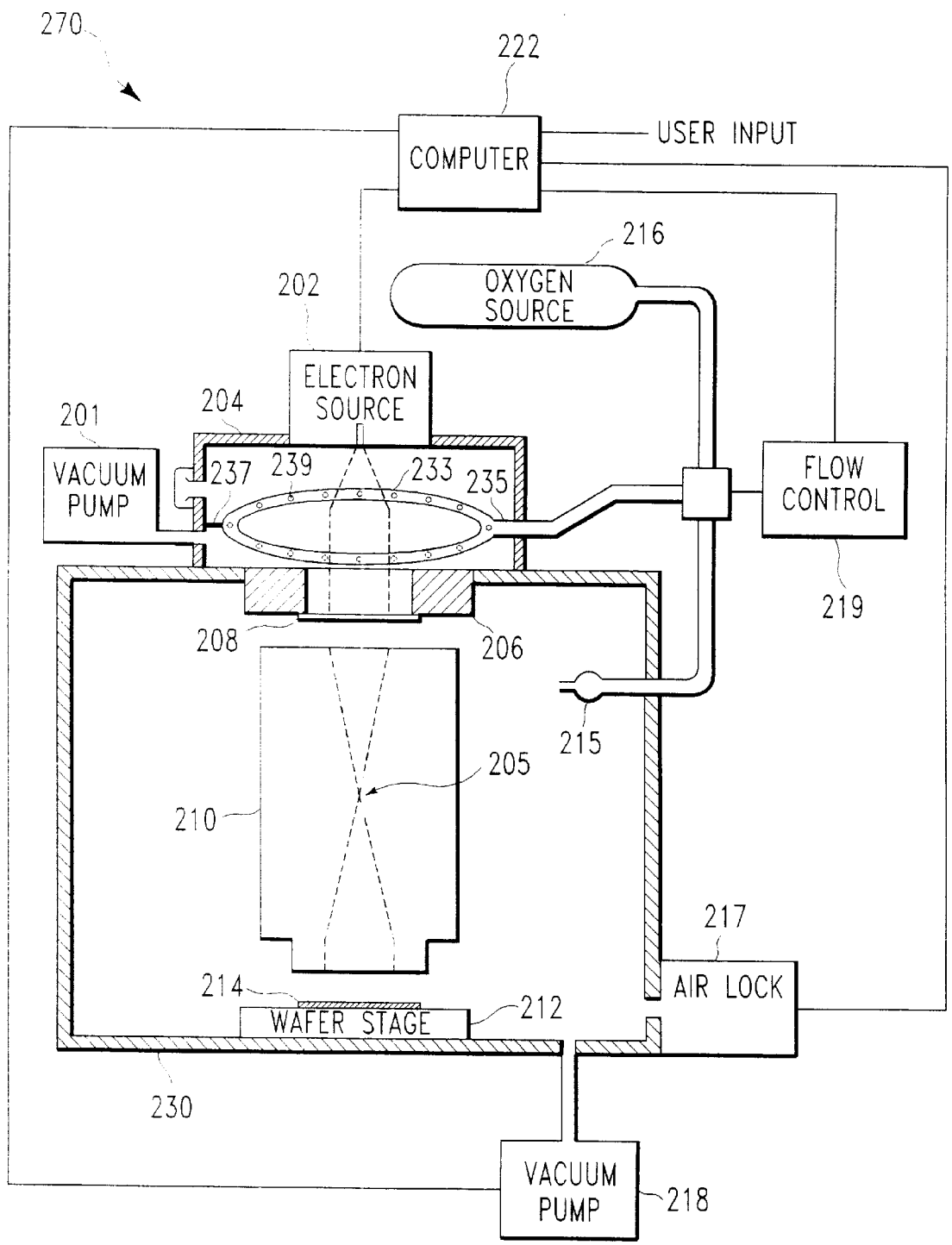
FIG. 2C illustrates an oxygen-based cleaning system for a sub-atmospheric electron beam lithography system, according to a further alternative embodiment of the present invention.

A further alternative embodiment of the present invention that implements a cleaning system for an electron beam lithography system is illustrated in FIG. 2C. In system 270 of FIG. 2C, the oxidizer is introduced into illumination chamber 204 through a circular inlet tube 233 that is proximately located around the mask 208. In one embodiment of the system 270 illustrated in FIG. 2C, inlet tube 233 is a hollow cylindrical tube that is formed into a continuous circular passage. The circular inlet tube 233 contains a plurality of holes 239 distributed around its surface. The circular inlet tube 233 is supported by one or more braces, such as brace 237 that are attached to the walls of illumination chamber 204. Oxidizer source 216 provides the oxidizer through passage 235 to circular inlet tube 233 and the oxidizer flows through the inlet tube and exits from the holes 239. In this manner, the oxidizer flows uniformly and directly across the surface of mask 208. It should be noted that the shape, size, and orientation of circular inlet tube 233 can be modified as required to direct the oxidizer across specific surfaces of the mask 208 or illumination chamber 204, or to concentrate the oxidizer flow across particular portions of the mask 208 or illumination chamber 204 surfaces. Because the inlet tube in system 270 is located in relatively close proximity to the mask 208, the embodiment illustrated in FIG. 2C generally provides a more concentrated and uniform flow of the oxidizer across the surface of the mask 208 than the embodiment illustrated in FIG. 2B. The configuration and operation of the other components illustrated in FIG. 2C correspond to the description provided above with reference to FIG. 2A.

For the embodiment illustrated in FIG. 2C, oxidizer may also be introduced into the imaging chamber by a nozzle 215 inserted into the process chamber 220. Alternatively, in system 270, oxidizer is introduced into the imaging chamber only through circular inlet tube 223.

It should be noted that other oxidizer introduction schemes in accordance with embodiments of the present invention are also possible. For example, in another alternative embodiment of the present invention, the oxidizer is introduced directly onto the surface of the mask, without being introduced into the imaging chamber. For this embodiment, one or more inlet passages are provided in the mask stage 206 to direct the oxidizer from the oxidizer source directly onto the mask 208.

In one embodiment of the present invention, the oxidizer that is introduced into the imaging chamber from the oxidizer source acts to oxidize any carbon contaminants that may be present within the chamber. Thus, any carbon residue or deposits on the mask and walls of the chamber, and on any other surface within the chamber is oxidized. The oxidization process transforms any carbon residue that is in solid form to a gaseous form. Likewise, any hydrocarbon gas that is present in the imaging chamber is oxidized by the oxidizer that is supplied by the oxidizer source. The oxidization process thus creates an oxidized carbon gas within the imaging chamber. Such a gas may be produced in the form of carbon monoxide (CO) or carbon dioxide ($CO_2$), or other volatile carbon-oxygen compounds. The oxidized carbon gas is a volatile gas species that can be evacuated from the imaging chamber to thereby remove the oxidized carbon contaminants.

In one embodiment of the present invention, the oxidizer is introduced into the imaging chamber for a period of time that is sufficient to thoroughly expose the mask or other desired surfaces to the oxidizer. The period of time generally depends upon the volume of the chamber, the amount of carbon build-up, and the sensitivity of wafer and mask features to oxidization. After the carbon deposits and residue have been oxidized, the resulting oxidized carbon gas is pumped out of the imaging chamber. In this manner, the carbon contamination within the imaging chamber is removed from the mask and/or chamber surfaces.

In one embodiment of the present invention, the oxidizer is introduced into the imaging chamber during the wafer fabrication process. For this embodiment, the mask is cleaned while the imaging chamber is maintained in a sub-atmospheric (partial vacuum) environment. As the oxidizer is directed across the mask, carbon deposits on the mask are oxidized. The resulting oxidized carbon gas is then pumped out of the imaging chamber by the operation of a vacuum pump.

Figure 3:
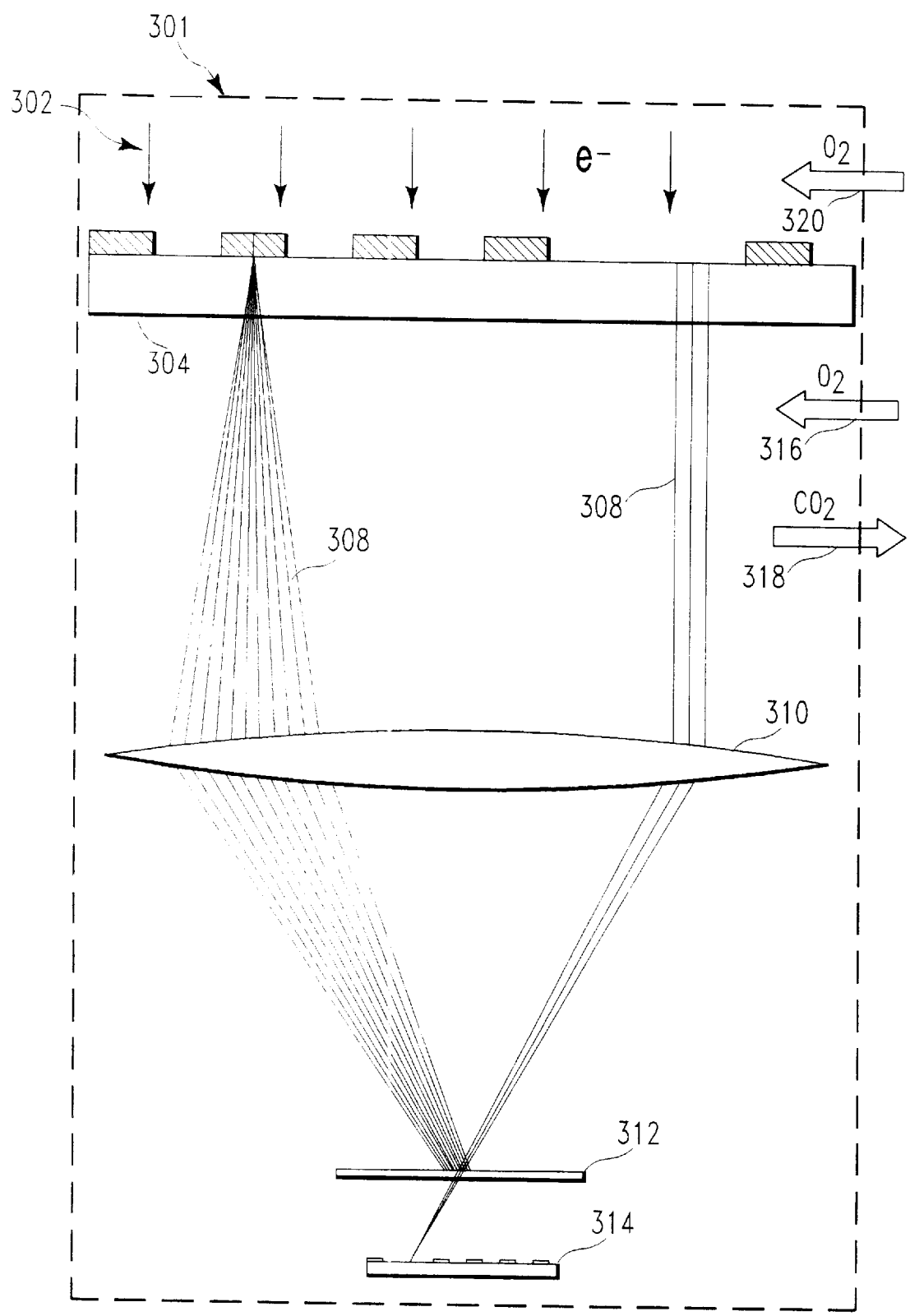
FIG. 3 is a more detailed diagram of the electron beam lithography system illustrated in FIG. 2A.

A more detailed illustration of the beam path in the imaging chamber of a particle beam lithography system is illustrated in FIG. 3. FIG. 3 illustrates typical charged particle beam paths for the SCALPEL lithography system illustrated in FIG. 2A. In FIG. 3, an electron flux 302 comprising a plurality of electron beams is projected through mask 304. In accordance with a SCALPEL lithography system, electron beams that strike the pattern layer of the mask 304 scatter, as illustrated by the scattered beams 306; while electron beams travel unscattered through the membrane, as illustrated by the unscattered beams 308. The unscattered electron beams 308 are focused by electron lens 310, illustrated as an optional lens for ease of understanding the present invention, and pass through a back-focal plane aperture 312 and impinge upon the wafer 314. The scattered beams 306 are redirected by electron lens 310 but are effectively blocked by aperture 312. During the imaging process for a SCALPEL system, the imaging chamber 301 is maintained at a sub-atmospheric pressure.

In one embodiment of the present invention, one or more oxidizer streams 316 and 320 are directed across the surface of the mask 304. Carbon deposits on the mask 304, as well as on other surfaces of the chamber 301 are then oxidized and transformed into a volatile gas species comprising, e.g., CO or $CO_2$. After reacting with the carbon deposits on the mask 304 features and the sides of the chamber, or on any other surface within the chamber, the resulting oxidized carbon gas (represented as carbon dioxide) 318 is evacuated from the chamber. FIG. 3 illustrates an embodiment of the present invention in which the oxidizer is introduced at a location close to the mask 304 and in a stream that is directed specifically at the mask 304. It should be noted, however, that the oxidizer can be introduced generally into the imaging chamber and allowed to naturally flow across the mask 304. In one embodiment of the present invention, the oxidizer stream 320 is provided by an oxidizer source and distribution apparatus, such as nozzle 224 of FIG. 2A; and the oxidized carbon gas stream 318 is evacuated by action of the vacuum pump 201 that maintains illumination chamber 204 at a sub-atmospheric pressure.

In one embodiment of the present invention, the oxidizer based cleaning process is used in a charged particle beam lithography system in which the mask 304 is covered by a protective covering, such as a pellicle as is used in optical lithography systems. In general, a pellicle is a transparent membrane that seals the mask (also referred to as a reticle) from harmful particle contamination. The pellicle is designed to be placed directly onto the mask to prevent particulates and other contaminants from falling onto the surface of the mask. Thus, contaminants will be deposited on the surface of the pellicle membrane instead of on the surface of the mask. These contaminants can then be removed without requiring cleaning of the mask surface. The pellicle membrane is typically held at a fixed distance from the mask surface. This serves to keep any particle contaminants out of focus and prevents them from being imaged onto the wafer.

Figure 5:
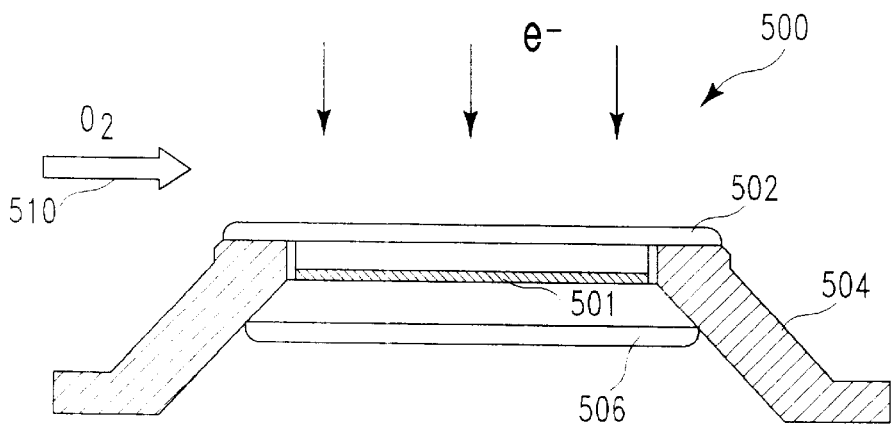
FIG. 5 illustrates a mask protection system that can be used in conjunction with embodiments of the present invention.

FIG. 5 illustrates an example of a pellicle that can be used in conjunction with embodiments of the present invention. Pellicle 500 comprises an upper pellicle membrane 502 that is held by a pellicle frame 504. Mask 501 is located at a fixed distance from pellicle membrane 502. For one embodiment of the present invention, mask 501 represents a mask that is used in a SCALPEL lithography system, such as mask 304 in FIG. 3. For this embodiment, pellicle membrane 502 is constructed of a material that is transparent to the charged particles (electrons) that are produced by the electron source. A back-side pellicle membrane 506 may also be provided to protect the back-side of mask 501 from contaminant deposits. In accordance with embodiments of the present invention, one or more oxidizer streams 510 are directed over a surface of pellicle membrane 502 to facilitate removal of any carbon deposits on the surface of pellicle membrane 502 or other surfaces of pellicle 500.

It should be noted that pellicle 500 shown in FIG. 5 illustrates one configuration of a pellicle that can be used with embodiments of the present invention, and that various other pellicle configurations are possible. Furthermore, FIG. 5 is an example of one type of mask protection system that can be used with embodiments of the present invention. Several other types of mask protection systems or transparent coatings can be used to protect the mask 501 and facilitate the removal of carbon deposits through the use of an oxidizer.

In one embodiment of the present invention, the cleaning process, which comprises the steps of introducing the oxidizer, oxidizing the carbon deposits to produce a volatile gas, and evacuating the oxidized carbon gas, is performed in periodically in a batch cleaning process. After a specific number of wafers have been imaged in the lithography system, an oxygen based cleaning process is performed to remove any accumulated carbon from the mask and chamber surfaces. Such a periodic process is performed at certain predetermined intervals or after a certain number of wafers have been processed to remove unwanted carbon deposits from the mask and surfaces in the chamber. In this cleaning process, the mask is cleaned in situ, without it being removed from the chamber. Since the cleaning process does not require the removal of the mask from the imaging chamber, system down time for cleaning is minimized and throughput of the wafer fabrication system can be maintained.

In an alternative embodiment of the present invention, the cleaning process is performed continuously and simultaneously with the electron-beam image projection process. In the continuous cleaning process, oxidizer is introduced into the chamber while, or immediately after, each wafer is processed. In this manner, carbon contaminants are continuously oxidized from the mask, wafer, and chamber surfaces during wafer imaging. For this embodiment, it is typically required that the oxidizer is introduced and evacuated at low pressures. This is to ensure that the pressure within the chamber does not exceed the sub-atmospheric pressures required for effective operation of the SCALPEL, or other charged particle beam lithography methods.

In a further alternative embodiment of the present invention, the mask is removed from the lithography system before the imaging chamber is cleaned by the oxidization process. Such a method is typically employed only when the chamber surfaces contain a heavy build-up of carbon residue and high pressures or long oxidizer exposure times are required to remove the deposits. For these cases, it is often undesirable to leave the mask or wafer in the chamber, since portions of the critical features may be undesirably oxidized along with the carbon deposits.

In one embodiment of the present invention, and with reference to FIG. 2A, the electron source 202 is turned off and the illumination chamber 204 is closed off from the process chamber 220 during the cleaning process. This allows oxidizer to be separately introduced into the separate chambers of the imaging chamber. This serves to contain the oxidizer in the process chamber 220 and prevent oxidization of the illumination chamber 204 and electron source 202 components. In an alternative embodiment of the present invention, the illumination chamber 204 is kept open to allow removal of any carbon deposits from the column and electron source 202.

Figure 4:
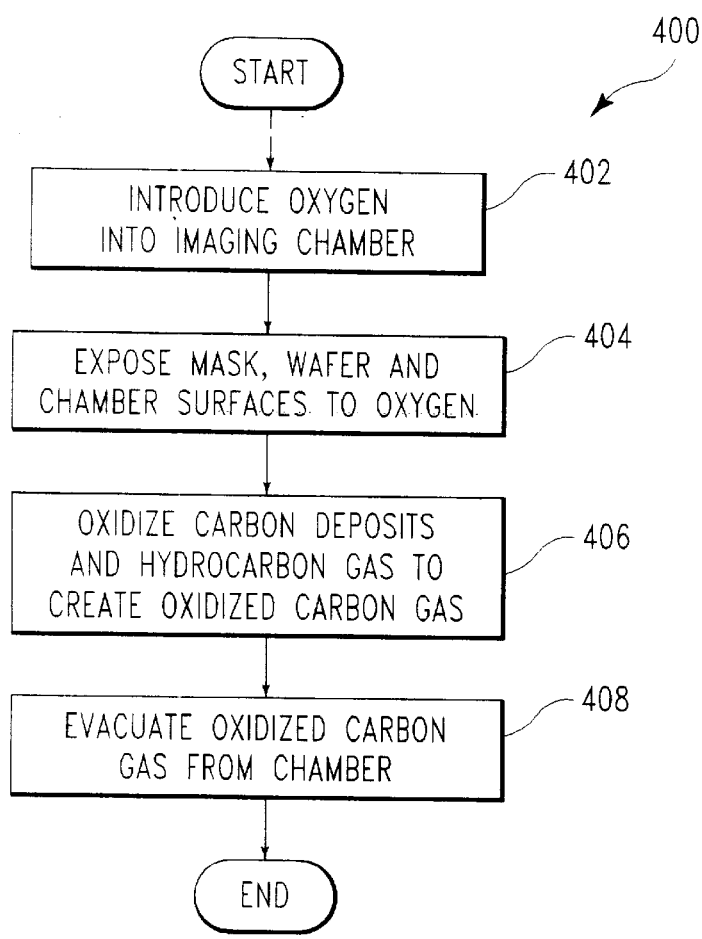
FIG. 4 is a flowchart that illustrates the steps of cleaning carbon deposits from an imaging chamber of a sub-atmospheric charged particle beam lithography system, according to one embodiment of the present invention.

FIG. 4 is a flowchart that illustrates the steps of cleaning carbon deposits from an imaging chamber of a sub-atmospheric charged particle beam lithography system, according to one embodiment of the present invention. In step 402, the oxidizer is introduced into the imaging chamber of the lithography system. As described above, the oxidizer may be in an activated state and may be supplied by a pure oxygen gas source or from an oxygen containing compound source. The oxidizer is introduced at flow rates and periods of time that maintain minimum or maximum required pressure levels in the imaging chamber. In step 404, the mask, wafer, and chamber surfaces in the imaging chamber are exposed to the oxidizer for a predetermined period of time. Alternatively, only the mask is exposed to the oxidizer, and the oxidizer distribution system is configured to direct the oxidizer only over the mask surface, and not generally into the imaging chamber.

For the embodiment illustrated in FIG. 4, the oxidizer in the imaging chamber is allowed to oxidize the carbon deposits on the mask, wafer, and chamber surfaces, as well as any incidental hydrocarbon gas that is present in the imaging chamber to create oxidized carbon in the form of a volatile gas species, step 406. The oxidized carbon gas is then pumped out of the imaging chamber, step 408. In this manner, the carbon deposits are removed along with the oxidizer that was pumped into the chamber. As stated above, the cleaning process outlined in FIG. 4 may be performed periodically at intervals related to the number of wafers process or continuously during the wafer fabrication process.

The use of the oxidizer in a sub-atmospheric charged particle beam lithography system, as described above, provides an efficient and cost-effective method of cleaning a mask that has been contaminated with carbon deposits. It also serves to prevent carbon contamination from building up on the mask by oxidizing hydrocarbon gas and other sources of carbon that may be present in the imaging chamber.

Although specific embodiments of the present invention have been discussed in relation to a SCALPEL lithography system, it will be appreciated by those of ordinary skill in the art that embodiments of the present invention may also be used in other types of sub-atmospheric charged particle beam lithography systems. Such systems may include micro-column electron beam systems, ion beam projection systems, Projection-Reduction Exposure with Variable Immersion Layer (PREVAIL) systems, and similar types of lithography systems. In these cases, the use of the oxidizer in the imaging or process chambers to produce volatilized carbon gas is performed in the same manner as described above in relation to the SCALPEL system.

In one embodiment of the present invention, the carbon deposit removal system can be used in a micro-column array (MCA) electron beam system used for semiconductor wafer fabrication, inspection, and/or metrology. MCA systems are typically built by arranging a number of single micro-column electron sources in either linear or rectangular arrays. Such arrays can be extended to form multi-column modules that that can be used to simultaneously scan a large number of semiconductor dies on a single wafer. When used in MCA lithography systems, the carbon deposit removal process serves to clean apertures that might become clogged with carbon contamination, or provide exposure dose control for carbon that may become built up on the surface of the resist coated mask substrate.

Figure 6:
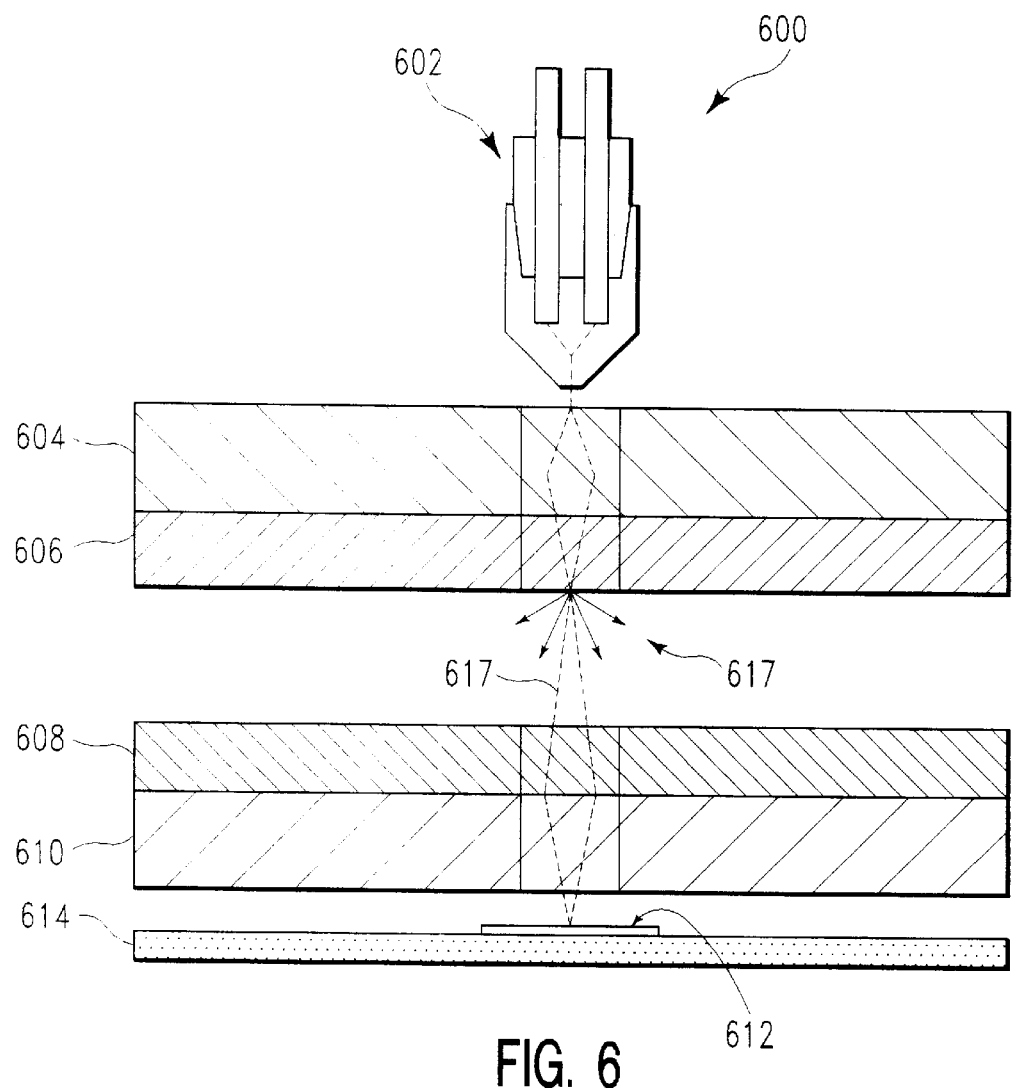
FIG. 6 illustrates a cross-sectional view of a single micro-column electron beam system that can be used in a micro-column array that may be used with embodiments of the present invention.

FIG. 6 illustrates a cross-sectional view of a single micro-column emitter/detector system that can be used in an MCA electron beam system, and that may be used with embodiments of the present invention. The single micro-column electron beam imaging system 600 comprises an electron emitter 602. The emitter 602 may be a Schottky emission cathode, tungsten cathode, cold field emission (CFE) emitter, or similar type of emitter. Emitter 602 generates a beam of electrons 616 that is focused and directed by the various lens and deflection systems that make up the single micro-column electron beam imaging system 600.

Electron beam 616 is first focused through gun 604. Gun 604 may be a multi-electrode (e.g., 3-electrode) source lens comprising layers of glass or Pyrex sandwiched between layers of silicon (the individual electrodes are not shown to avoid obscuring the illustration). The electron beam is directed from gun 604 through deflector 606. The deflector 606 can also be fabricated from bulk silicon and glass.

Electron beam imaging system 600 also includes an in-column detector 608. Detector 608 serves to block or refocus secondary electron beam emissions 617 created by the gun and deflector lenses. Electron beam 616 is focused to produce an imaging beam by objective lens 610. Objective lens 610 focuses the final beam onto semiconductor die 612 on wafer 614. When used with embodiments of the present invention, the electron beam imaging system 600 typically comprises an imaging chamber of a lithography system for semiconductor fabrication. In one embodiment, the imaging chamber incorporating electron beam imaging system 600 uses electrostatic force to focus and direct the electron beam. In an alternative embodiment, the imaging chamber uses magnetic force to focus and direct the electron beam.

Figure 7:
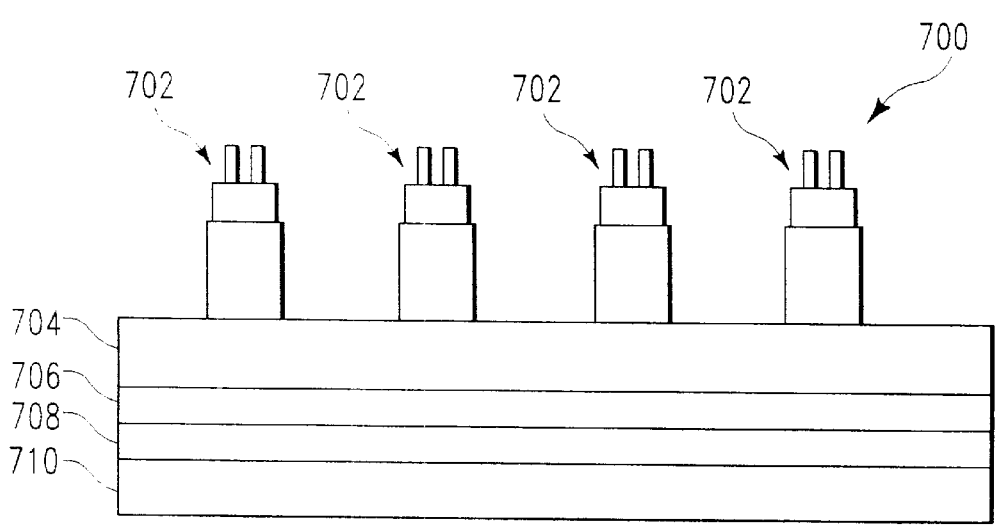
FIG. 7 illustrates an example of a linear micro-column sub-array that consists of several single micro-column emitters arranged in-line.

As stated previously, the single micro-column electron beam imaging system 600 can be used to form a micro-column array system comprising multiple micro-columns in an array. FIG. 7 illustrates an example of a linear micro-column sub-array that consists of several single microcolumn emitters arranged in-line. Sub-array 700 illustrates a four column array. In one embodiment of the present invention, the sub-array of micro-columns is fabricated by slicing the processed silicon wafers that form the lens structures into arrays rather than a single die. Thus, the gun 704, deflector 706, detector 708, and objective lens 710 layers for each of the emitters 702, can be fabricated from a monolithic assembly.

It should be noted that the sub-array illustrated in FIG. 7 is simply one example of a configuration for a multi-column array. The contamination cleaning apparatus of the present invention can be used with any number of micro-columns arrayed in various configurations. For example, in FIG. 7, a one-by-four configuration is illustrated, however, the sub-array can be configured as a one-by-five, one-by-six, two-by-four assembly, and so on.

Figure 8:
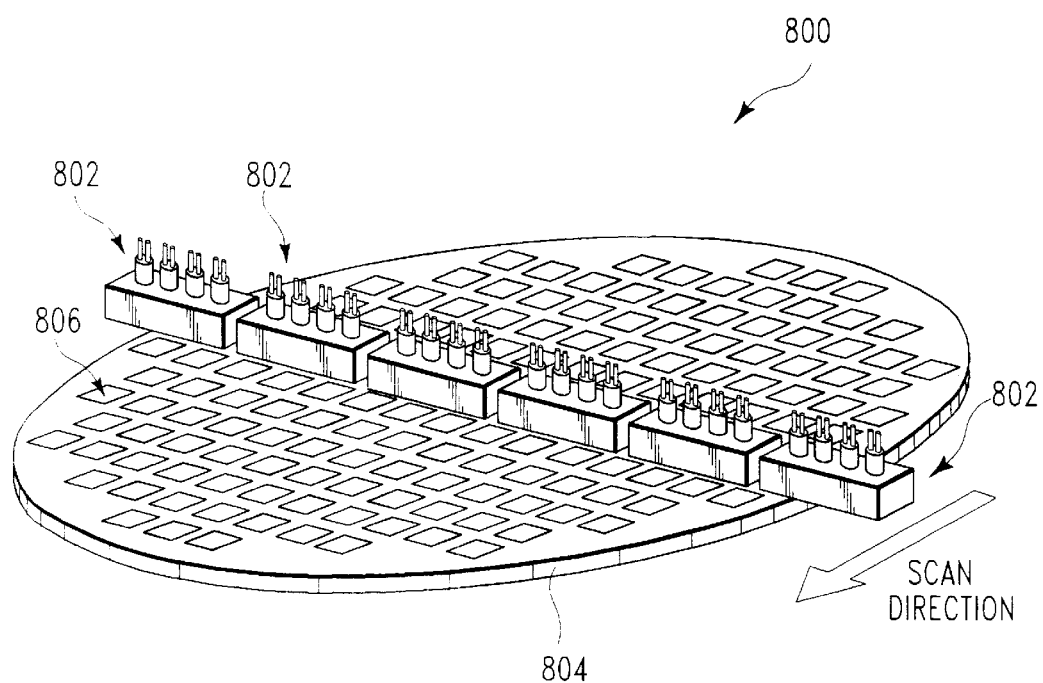
FIG. 8 illustrates a micro-column array composed of a number of micro-column sub-arrays positioned over a wafer.

In one embodiment of the present invention, a micro-column sub-array, such as that illustrated in FIG. 7, can be used to form a micro-column array for simultaneously imaging a large number of die on a single wafer. FIG. 8 illustrates six micro-column sub arrays, each in a one-by-four configuration forming a 24 column module positioned over a wafer. In MCA system 800, the sub-arrays 802 move in the indicated scan direction to simultaneously image individual die 806 on wafer 804.

The MCA system illustrated in FIG. 8 may be used for fabrication, inspection and/or metrology of wafer 804. Depending upon the application of the MCA system, the configuration and fabrication of the sub-arrays 802 and the individual emitter systems 600 may be modified. For example, for inspection, the position of certain lens elements, such as the gun and detector can be moved relative to one another to optimize the performance of the emitter for inspection functions.

The multi-column array system 800 is typically housed within an imaging chamber of a wafer fabrication system. In one embodiment of the present invention, the oxygen based, carbon cleaning system described previously is connected to the imaging chamber in a similar manner as shown in FIG. 2A. An oxidizer source and vacuum pump are both coupled to the imaging chamber. The oxygen source functions to oxidize carbon deposits present on the wafer, the walls of the imaging chamber, or on any other surfaces of the MCA system. The resulting oxidized carbon gas is evacuated from the imaging chamber through the operation of the vacuum pump.

It should be understood that although specific configurations of the micro-column emitter and micro-column array structure were illustrated, several other configurations of MCA systems are possible, according to alternative embodiments of the present invention.

In the foregoing, a carbon deposit removal system for use in a sub-atmospheric pressure charged particle beam lithography system has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus for patterning semiconductor wafers using charged particle beam lithography comprising;
    one or more charged particles sources arranged in a micro-column array structure;
    an imaging chamber including a wafer stage, one or more charged particle beam imaging components, and a mask stage configured to receive a patterned mask;
    an oxidizer source coupled to the imaging chamber;
    an oxidizer distribution mechanism coupled to the oxidizer source, the oxidizer distribution mechanism configured to introduce an oxidizer produced by the oxidizer source across a surface of the patterned mask installed on the mask stage, the oxidizer distribution mechanism comprising an oxidizer injection manifold including a plurality of oxidizer inlet holes distributed on a surface of the oxidizer injection manifold and flush against an inside surface of the imaging chamber; and
    a vacuum pump coupled to the imaging chamber to produce a sub-atmospheric pressure environment within the imaging chamber.

2. The apparatus of claim 1 wherein the oxidizer source is configured to produce an oxidizer selected from the group consisting of $O_2$, $O_3$, $N_2O$, water vapor doped oxygen compounds, and alcohols.

3. The apparatus of claim 1 wherein the oxidizer distribution mechanism is configured to direct a stream of oxidizer produced by the oxidizer source directly across the surface of the patterned mask.

4. The apparatus of claim 1 wherein the oxidizer injection manifold is configured to introduce oxidizer produced by the oxidizer source into the imaging chamber in a plurality of oxidizer streams directed at an area proximate to the surface of the patterned mask.

5. The apparatus of claim 1 wherein the oxidizer distribution mechanism comprises a circular oxidizer inlet tube proximately located around the mask stage, the circular inlet tube including a plurality of holes distributed on a surface of the circular inlet tube, wherein the circular oxidizer inlet tube is configured to direct oxidizer produced by the oxidizer source in a plurality of oxidizer streams across the surface of the patterned mask.

6. The apparatus of claim 1 wherein the oxidizer source activates the oxidizer to produce an activated oxidizer.

7. The apparatus of claim 6 wherein the oxidizer source further comprises an activator selected from the group consisting of a thermal activator, an ozone activator, and a microwave activator.

8. The apparatus of claim 1 wherein the one or more charged particles sources each comprises an electron source, and wherein the imaging chamber comprises an element of a micro-column array electron beam lithography system.

9. An apparatus for processing semiconductor wafers using charged particle beam lithography comprising:
    an array of charged particle sources;
    an imaging chamber including the array charged particle sources, a wafer stage, one or more charged particle beam imaging components, and a mask stage configured to receive a patterned mask;
    an oxidizer source coupled to the mask stage, the oxidizer source configured to produce an oxidizer and direct the oxidizer across a surface of the patterned mask through one or more inlet passages provided in the mask stage to react with contaminants present on the surface of the patterned mask, to thereby produce a volatile gas; and
    a vacuum pump coupled to the imaging chamber to produce a sub-atmospheric pressure environment within the imaging chamber, and configured to evacuate the volatile gas from the imaging chamber.

10. The apparatus of claim 9 wherein the oxidizer is selected from the group consisting of $O_2$, $O_3$, $N_2O$, water vapor, doped oxygen compounds, and alcohols.

11. A method of eliminating carbon contamination from an imaging chamber of a sub-atmospheric, micro-column array electron beam lithography system, the method comprising the steps of:

introducing an oxidizer into the imaging chamber;

exposing a mask coupled to the imaging chamber, and surfaces inside of the imaging chamber, to the oxidizer;

directing the oxidizer directly across the surface of the mask through one or more inlet passages provided in a mask stage supporting the mask;

allowing the oxidizer to oxidize carbon deposits on the mask and the inside surfaces of the imaging chamber to produce an oxidized carbon gas; and maintaining a sub-atmospheric pressure environment immediately proximate to the mask to thereby evacuate the oxidized carbon gas from the imaging chamber.

12. The method of claim 11 wherein the oxidizer is selected from the group consisting of $O_2$, $O_3$, $N_2O$, water vapor, doped oxygen compounds, and alcohols.

13. The method of claim 11 further comprising the step of activating the oxidizer to produce an activated oxidizer prior to performing the step of introducing the oxidizer into the imaging chamber.

14. The method of claim 13 wherein the step of producing an activated oxidizer is selected from the group consisting of thermally activating the oxidizer, ozone activation of the oxidizer, and microwave activation of the oxidizer.

15. The method of claim 11 further comprising the step of metering the flow rate of the oxidizer introduced into the imaging chamber to maintain the sub-atmospheric pressure environment immediately proximate to the mask.

16. The method of claim 15 wherein the step of introducing an oxidizer into the imaging chamber is performed after a specific number of semiconductor wafers are processed in the electron beam lithography system.

17. The method of claim 15 wherein the step of introducing an oxidizer into the imaging chamber is performed continuously during processing of semiconductor wafers in the charged particle beam lithography system.

18. A method of eliminating carbon contamination deposits from a surface of an image mask used in a sub-atmospherically pressurized, multi-column array, electron beam lithography system, the method comprising the steps of:

directing one or more oxidizer streams across a contaminated surface of the image mask through one or more inlet passages provided in a mask stage supporting the image mask;

exposing the image mask to an oxidizer;

allowing the oxidizer to oxidize the carbon contamination deposits on the image mask to produce an oxidized carbon gas; and maintaining a sub-atmospheric pressure environment immediately proximate to the image mask to thereby evacuate the oxidized carbon gas from the proximity of the image mask.

19. The method of claim 18 wherein the oxidizer is selected from the group consisting of $O_2$, $O_3$, $N_2O$, water vapor, doped oxygen compounds and alcohols.

20. The method of claim 18 further comprising the step of activating the oxidizer to produce an activated oxidizer prior to performing the step of directing one or more oxidizer streams across the contaminated surface of the image mask.

21. The method of claim 20 wherein the step of producing an activated oxidizer is selected from the group consisting of thermally activating the oxidizer, ozone activation of the oxidizer, and microwave activation of the oxidizer.

22. The method of claim 18 further comprising the step of metering the flow rate of the oxidizer introduced into an imaging chamber of the charged particle beam lithography system to maintain the sub-atmospheric pressure created around the mask.

\* \* \* \* \*